United States Patent
Alrod et al.

(10) Patent No.: US 11,061,768 B1
(45) Date of Patent: Jul. 13, 2021

(54) STORAGE DEVICE WITH INCREASED ENDURANCE

(71) Applicant: Western Digital Technologies, Inc., San Jose, CA (US)

(72) Inventors: Idan Alrod, Herzliya (IL); Judah Gamliel Hahn, Ofra (IL); Ariel Navon, Revava (IL); Eran Sharon, Rishon Lezion (IL); Dudy Avraham, Even Yehuda (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/791,560

(22) Filed: Feb. 14, 2020

(51) Int. Cl.
*G06F 11/10* (2006.01)
*G11C 16/10* (2006.01)
*G11C 16/34* (2006.01)
*G06F 11/30* (2006.01)

(52) U.S. Cl.
CPC ...... *G06F 11/1068* (2013.01); *G06F 11/1044* (2013.01); *G06F 11/3037* (2013.01); *G11C 16/10* (2013.01); *G11C 16/349* (2013.01)

(58) Field of Classification Search
CPC ............. G06F 11/1068; G06F 11/1044; G06F 11/3037; G11C 16/10; G11C 16/349
See application file for complete search history.

(56) References Cited

U.S. PATENT DOCUMENTS

| | | | |
|---|---|---|---|
| 9,330,784 B2 | 5/2016 | Pangal et al. | |
| 9,792,071 B2 | 10/2017 | Gorobets et al. | |
| 10,090,044 B2 | 10/2018 | Achtenberg et al. | |
| 10,096,355 B2 | 10/2018 | Yang et al. | |
| 2011/0154163 A1* | 6/2011 | Cornwell | G06F 11/0727 714/773 |
| 2014/0082459 A1* | 3/2014 | Li | G11C 29/52 714/773 |
| 2017/0062069 A1* | 3/2017 | Yang | G11C 16/3445 |
| 2017/0182956 A1* | 6/2017 | Naboulsi | G06F 3/0227 |
| 2019/0377635 A1* | 12/2019 | Xiong | H03M 13/3723 |

OTHER PUBLICATIONS

Dong, G. et al.; Using Lifetime-Aware Progressive Programming to Improve SLC NAND Flash Memory Write Endurance; IEEE Transactions on Very Large Scale Integration (VLSI) Systems, vol. 22, No. 6, Jun. 2014, 11 pages.
Jagmohan, A. et al. Adaptive Endurance Coding for NAND Flash; IEEE Globecom 2010 Workshop on Application of Communication Theory to Emerging Memory Technologies, 5 pages.

* cited by examiner

*Primary Examiner* — Guy J Lamarre
(74) *Attorney, Agent, or Firm* — Morgan, Lewis & Bockius LLP (57) ABSTRACT

A black box device for a vehicle includes a data storage system for recording event data fed to the black box from various vehicle sensors. The data storage system includes a memory having memory cells and a controller in communication with the memory. The controller is configured to receive data and determine one or more memory cells as a destination for the data to be written. The controller is configured to determine a wear level of the memory cells and select a subset of program states of the memory cells based on the wear level; and program the memory cells using respective subsets of program states for each respective memory cell.

19 Claims, 8 Drawing Sheets

SLC
410

Cell

MLC
420

Cell

TLC
430

Cell

STORAGE DEVICE WITH INCREASED ENDURANCE

TECHNICAL FIELD

The present disclosure relates to memory systems, and in particular, to increasing endurance in storage devices.

BACKGROUND

Recent legislation requires manufacturers of vehicles equipped with an autopilot function to install a black box to help determine responsibility in the event of an accident. The use of a black box may help ensure that automated driving technology can be deployed safely. Black boxes may be required to record when the autopilot system was active, when the driver drove the vehicle, and when the system requested that the driver take over the driving of the vehicle. In addition, black boxes may be required to remain operable and reliably required data for many years. Hence, a storage device with high endurance may be required in black boxes.

SUMMARY

The implementations described herein describe storage devices with improved endurance. Various implementations of systems, methods and devices within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to reduce bit error rate in first read scenarios.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

The various implementations described herein include systems, methods and/or devices with increased endurance while minimizing additional cost resulting from increased memory.

Numerous details are described herein in order to provide a thorough understanding of the example implementations illustrated in the accompanying drawings. However, the invention may be practiced without many of the specific details. And, well-known methods, components, and circuits have not been described in exhaustive detail so as not to unnecessarily obscure more pertinent aspects of the implementations described herein. While the technology described herein is particularly relevant to vehicle block box recording equipment, it will be understood by those of skill in the art that the technology may be applied to other equipment and devices, such as Internet of Things (TOT) devices.

Figure 1:
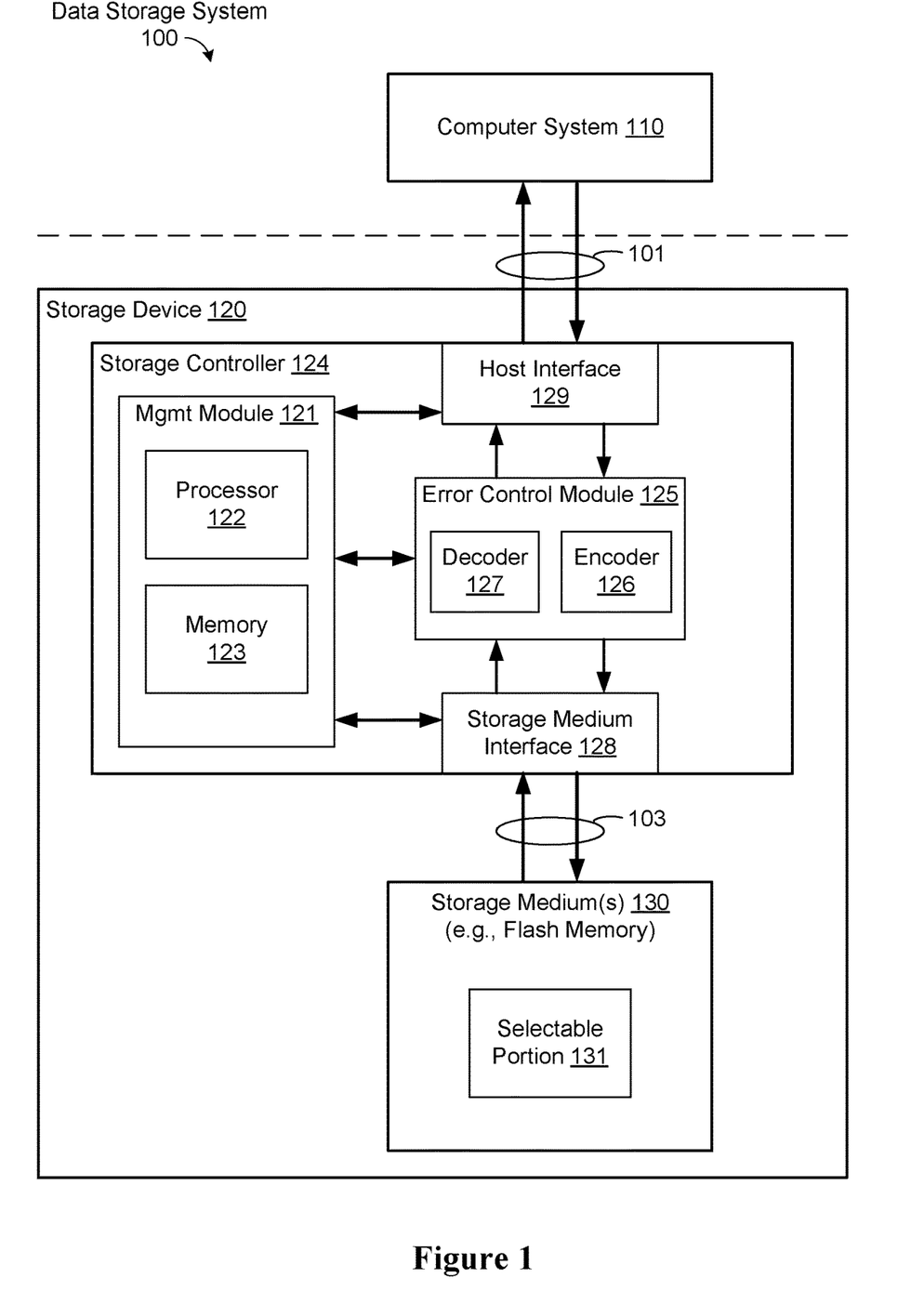
FIG. 1 is a block diagram of a data storage system in accordance with some embodiments.

FIG. 1 is a diagram of an implementation of a data storage environment, namely data storage system 100. An example storage system may be a black-box event data recorder (EDR) for a vehicle such as an automobile, truck, train, airplane, and so forth. However, the concepts described herein may be applied to other data storage systems, including but not limited to storage systems for computing devices such as a computer, a laptop computer, a tablet device, a netbook, an internet kiosk, a personal digital assistant, a mobile phone, a smart phone, a gaming device, a computer server, an internet-of-things (TOT) device, a smart home device, or any other computing device. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, data storage system 100 includes data processing system (alternatively referred to herein as a computer system or host) 110, and storage device 120.

Host 110 is coupled to storage device 120 through data connections 101. In various implementations, host 110 includes storage device 120 as a component. In some implementations, host 110 includes one or more processors, one or more types of memory, a display and/or other user interface components such as a keyboard, a touch screen display, a mouse, a track-pad, a digital camera and/or any number of supplemental devices to add functionality.

Storage device 120 includes one or more storage mediums 130 (sometimes referred to as nonvolatile memories, or NVMs) coupled to storage controller 124 through data connections 103. In various implementations, storage controller 124 and storage medium(s) 130 are included in the same device (e.g., storage device 120) as constituent components thereof, while in other embodiments, storage controller 124 and storage medium(s) 130 are, or are in, separate devices. Each storage medium 130 includes any number (i.e., one or more) of memory devices including, without limitation, non-volatile semiconductor memory devices, such as flash memory. For example, flash memory devices can be configured for enterprise storage suitable for applications such as cloud computing. Additionally or alternatively, flash memory devices can also be configured for relatively smaller-scale applications such as personal flash drives or hard-disk replacements for personal, laptop and tablet computers. In some implementations, a storage medium 130 comprises one or more flash memory devices. In some implementations, a storage medium 130 comprises at least one of NAND-type flash memory and/or NOR-type flash memory.

Storage mediums are often divided into a number of addressable and individually selectable blocks, such as selectable portion 131. In some implementations, for flash memory, the individually selectable blocks are the minimum erasable units in a flash memory device. In other words, each block contains a minimum number of memory cells that can be erased simultaneously. Each block is usually further divided into a plurality of pages, where each page is typically an instance of a minimum unit of the smallest individually accessible sub-block in the block. However, in some implementations (e.g., in some types of flash memory), the minimum unit of individually accessible data is a sector, which is a subset of a page. That is, each page contains a plurality of sectors and each sector is the minimum unit of individually accessible data for writing data to or reading data from the flash memory device.

For the sake of notation only, a block of data includes a plurality of pages, typically a fixed number of pages per block, and each page includes a plurality of sectors, typically a fixed number of sectors per page. For example, in some implementations, one block includes 64 pages, 128 pages, 256 pages, or another suitable number of pages. The respective sizes of blocks, pages and sectors are often a matter of design choice or end-user choice, and often differ across a wide range of enterprise and consumer devices. However, for example only, and without limitation, in some enterprise applications a page includes 2K (i.e., 2048) to 16K bytes, and a sector includes anywhere from 256 bytes to 544 bytes. Those ranges may be extended upward or downward, and/or shrink or expand depending on a particular application. In some embodiments, each page stores one or more codewords, where a codeword is the smallest unit of data that is separately encoded and decoded by the encoder and decoder mechanisms of a particular device.

The storage medium (NVM) 130 may comprise a number of grown physical bad blocks (also referred to as grown dead blocks). Grown dead blocks are blocks which, during usage of the storage device, become bad (i.e., cannot meet one or more data lifetime specifications). Grown dead blocks are typically decommissioned since they can no longer be reliably written to. Decommissioned blocks become read-only. In some implementations, the number of grown physical bad blocks may be tolerated up to and past about 5% of all physical blocks (or of all addressable blocks), and up to about 95% of all physical blocks (or of all addressable blocks), where "about" signifies plus or minus 10% of the value. It should be understood that other numbers of grown physical bad blocks may be allowed based on the application. Therefore, the aforementioned disclosure directed to the number being 5% of all blocks should not be construed as being a required limitation.

In some implementations, the storage medium (NVM) 130 has a ratio of defined export capacity to physical capacity that is greater than 0.02 and less than about 0.50 (where "about" signifies plus or minus 10% of the value). Export capacity, also referred to as user capacity, host export capacity, and host address range, is the size of the storage medium from the perspective of a user or host. More formally, export capacity is defined by the address range that is available for the host to write to times the number of bytes per address. For example, if the host writes data in units of 4 KB, and there are 1,024 available address for writing those units of data, then the export capacity is 4,096 KB (approximately 4 MB). Physical capacity, on the other hand, is the physical size of the storage medium (the total number of memory cells). The export capacity is allotted for the data to be written as specified by the host, while the remaining memory cells (physically present but not included in the address range) are typically used for error correction (e.g., ECC, parity bits, and so forth). It should be understood that other ratios may be allowed based on the application. Therefore, the aforementioned disclosure directed to the ratio being greater than 0.02 and less than about 0.50 should not be construed as being a required limitation.

In some implementations, storage controller 124 includes management module 121, error control module 125, storage medium interface (I/O) 128 and host interface 129. Host interface 129 couples storage device 120 and its storage controller 124 to one or more hosts 110, while storage medium interface 128 couples storage controller 124 to storage medium(s) 130. In some implementations, storage controller 124 includes various additional features that have not been illustrated for the sake of brevity, and so as not to obscure more pertinent features of the example implementations disclosed herein, and that a different arrangement of features may be possible.

Host interface 129 typically includes data buffers (not shown) to buffer data being received and transmitted by storage device 120, via data connections 101. Similarly, storage medium I/O 128 provides an interface to storage medium(s) 130 though data connections 103. In some implementations, storage medium interface 128 includes read and write circuitry.

In some implementations, management module 121 includes one or more processors 122. However, in some implementations, processor 122 is shared by one or more components within, and in some cases, beyond the function of storage controller 124. Management module 121 is coupled to host interface 129, error control module 125 and storage medium I/O 128 in order to coordinate the operation of these components.

Error control module 125 is coupled between storage medium I/O 128 and host interface 129. In some implementations, error control module 125 is provided to limit the number of uncorrectable errors inadvertently introduced into data. To that end, error control module 125 includes encoder 126 and decoder 127. Encoder 126 encodes data to produce a codeword which is subsequently stored in a storage medium 130. When the encoded data is read from the storage medium 130, decoder 127 applies a decoding process to recover the data, and correct errors within the error correcting capability of the error control code. Various error control codes have different error detection and correction capacities, and particular codes are selected for various applications.

In some implementations, the error control module 125 is configured to calculate an error correcting code (ECC) for data received from the host 110 and save the ECC with the received data. In some implementations, an ECC code rate is less than about 0.60 (where "about" signifies plus or minus 10% of the value). It should be understood that other ECC code rates may be required based on the application.

Therefore, the aforementioned disclosure directed to the ECC code rate of 0.60 should not be construed as being a required limitation.

Management module 121 typically includes one or more processors 122 (sometimes referred to herein as CPUs, processing units, hardware processors, processors, microprocessors or microcontrollers) for executing modules, programs and/or instructions stored in memory and thereby performing processing operations. Management module 121 also includes memory 123 (sometimes referred to herein as controller memory), and one or more communication buses for interconnecting these components. Communication buses optionally include circuitry (sometimes called a chipset) that interconnects and controls communications between system components. Management module 121 is coupled by communication buses to storage medium interface 128, error control module 125, and host interface 129. The controller memory 123 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The controller memory 123 optionally includes one or more storage devices remotely located from the one or more processors 122. In some embodiments, the controller memory 123, or alternatively the non-volatile memory device(s) within the controller memory 123, comprises a non-transitory computer readable storage medium. In some embodiments, the controller memory 123, or the non-transitory computer readable storage medium of the controller memory 123, stores the one or more programs, modules, and data structures, or a subset or superset thereof, for performing the operations described herein.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 123 may store a subset of the modules and data structures identified above. Furthermore, memory 123 may store additional modules and data structures not described above. In some embodiments, the programs, modules, and data structures stored in memory 123, or the non-transitory computer readable storage medium of memory 123, provide instructions for implementing any of the methods described below. Stated another way, the programs or modules stored in memory 123, when executed by the one or more processors 122, cause storage device 120 to perform any of the methods described below. Although FIG. 1 shows various modules, FIG. 1 is intended more as functional description of the various features which may be present in the modules than as a structural schematic of the embodiments described herein. In practice, the programs, modules, and data structures shown separately could be combined, and some programs, modules, and data structures could be separated.

Figure 2:
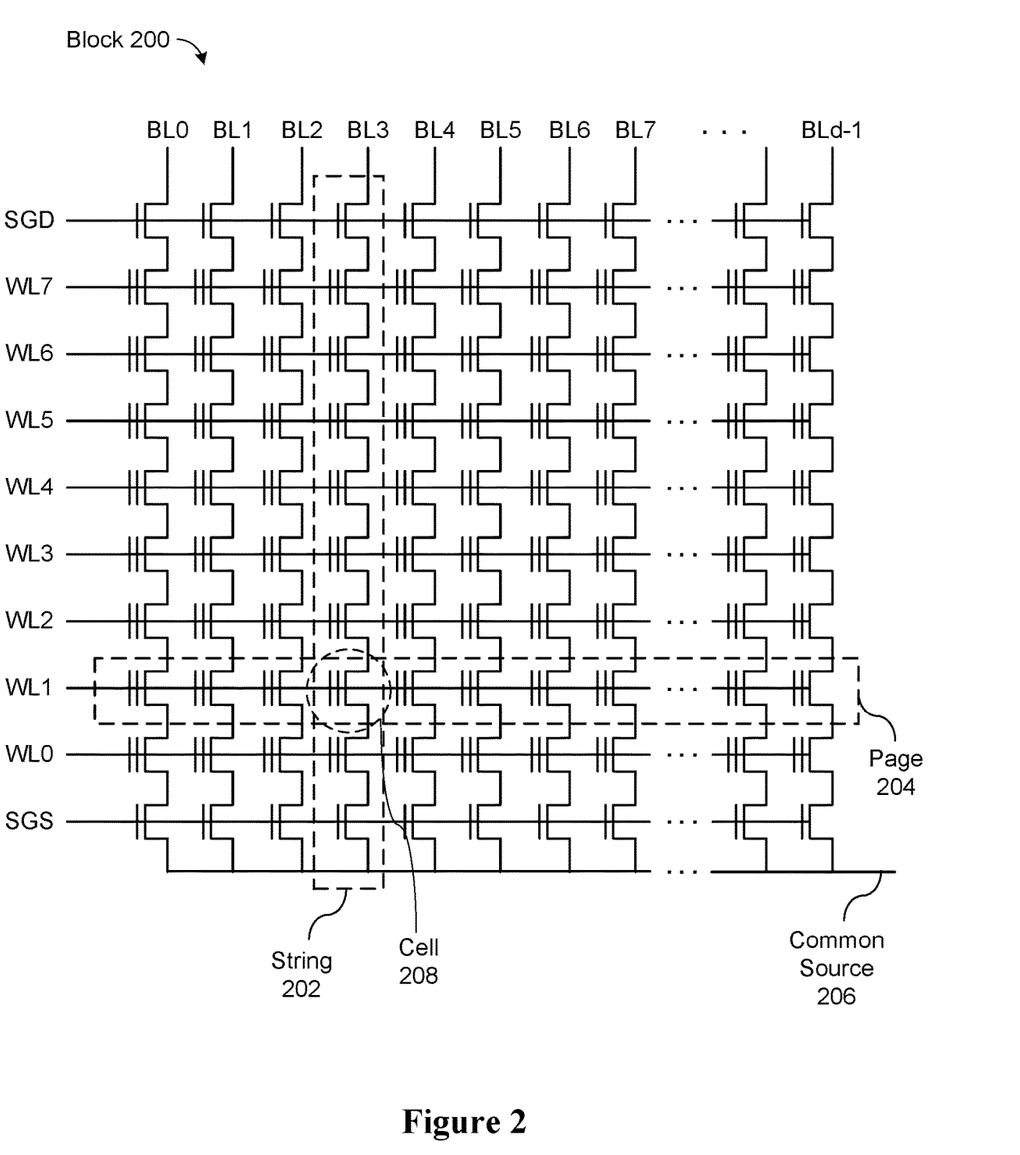
FIG. 2 is a diagram of a memory cell array in the storage medium of a storage device in accordance with some embodiments.

FIG. 2 depicts an example block 200 of a memory cell array including selectable portions 131 (FIG. 1) of storage medium 130. In this example, the memory cell array is configured as a NAND array. The depicted configuration is one among many possible configurations, and various other configurations (e.g., NOR array, 3D NAND, and so forth) have not been illustrated for the sake of brevity, and so as not to obscure more pertinent aspects of the example implementations disclosed herein.

In the example array, strings 202 (columns) are the smallest readable units and may be comprised of 32 or 64 memory cells. Strings may comprise other numbers of memory cells (e.g., more than 64, less than 32, or between 32 and 64), depending on the application. All strings in the array are connected at one end to a common source line 206 and at the other end to a bit line (e.g., BL3). Each string also contains two control transistors in series with the memory cells. String and ground select transistors are connected to the string select line (SGD) and ground select line (SGS), respectively.

In the example array, pages 204 (rows) share the same word line and are the smallest programmable units. They may be comprised of at least 32,768 (32K), 64K, or 128K memory cells. Pages may comprise other numbers of memory cells (e.g., more than 128K, less than 32K, or between 32K and 128K), depending on the application. Typically, page sizes are referred to as 2K, 4K, 8K, and so forth. This signifies the page size in bytes. So if the page size has 32,768 memory cells (bits), this equates to 4,096 (4K) bytes.

In the example array, block 200 is a two-dimensional matrix comprised of strings (columns) and pages (rows). The total number of bits in a block can be calculated by multiplying the number of strings by the number of pages. Depending on the memory operation to be carried out (e.g., read, program, erase), a selectable portion 131 of storage medium 130 includes a single page, a single string, or a single block.

Figure 4A:
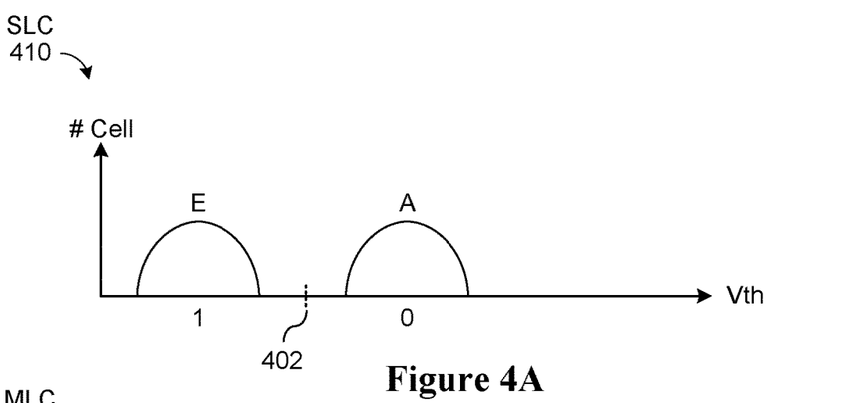
FIGS. 4A-4C are graphs showing threshold voltage distributions of example memory cells, in accordance with some embodiments.
Figure 4B:
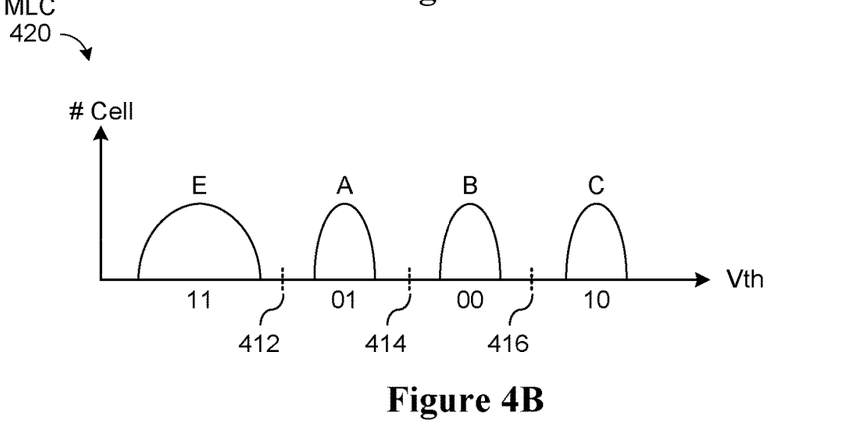
Figure 4C:
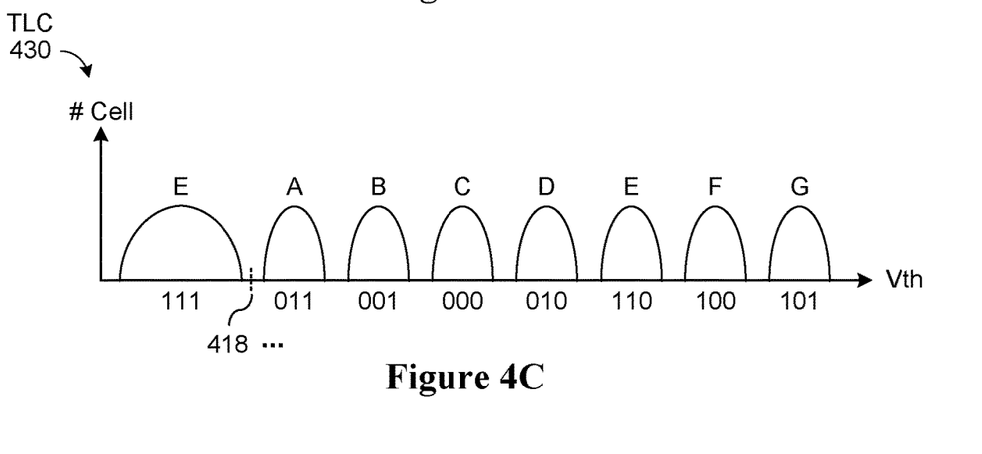

The memory cells in the memory array may have a threshold voltage Vth included in one of the distributions of FIGS. 4A-4C. FIG. 4A shows a cell distribution in a single-level cell (SLC) memory in which each cell is programmed by one bit. FIG. 4B shows a cell distribution in a 2-bit multi-level cell (MLC) memory in which each cell is programmed by two bits. FIG. 4C shows a cell distribution in a 3-bit multi-level cell (TLC) memory in which each cell is programmed by three bits. For an SLC flash memory, each cell of the array of FIG. 2 has a threshold voltage that is included in an erase state E or a program state A according to a value of programmed data, as shown in FIG. 4A. For a 2-bit MLC flash memory, each cell of the array of FIG. 2 has a threshold voltage that is included in an erase state E or any one of first to third program states A-C, as shown in FIG. 4B. For a 3-bit MLC flash memory, each cell of the array of FIG. 2 has a threshold voltage that is included in an erase state E or any one of first to seventh program states A-G, as shown in FIG. 4C. However, the embodiments described herein are not limited to these three configurations. For instance, each cell may be programmed by four bits (QLC cells), five bits (PLC cells), or more than five bits. Moreover, various cells in an array may be programmed by different numbers of bits, depending on the application.

Referring back to FIG. 2, reading the state of a memory cell (e.g., 208) requires discriminating voltage threshold levels of the cell, irrespective of the voltage threshold levels of all other cells in the string. To accomplish this, the string (e.g., 202) is connected to the sensing circuit (e.g., select lines SGD and SGS are high), and a particular bit line (e.g., BL3) is biased; therefore, a current can flow (e.g., through string 202) to the (grounded) source line. Unselected cells (e.g., the cells coupled to WL0 and WL2 through WL7) are placed in a pass-transistor mode, biasing their word lines at a pass voltage larger than the maximum threshold voltage Vth. The actual read operation is then performed by applying a read voltage (e.g., to WL1), sensing the cell current through the string (BL3) of cells, and comparing the sensed current against fixed reference values to assess the corresponding binary code. The operation is performed more than one time for MLC, TLC, and QLC cells.

Figure 3:
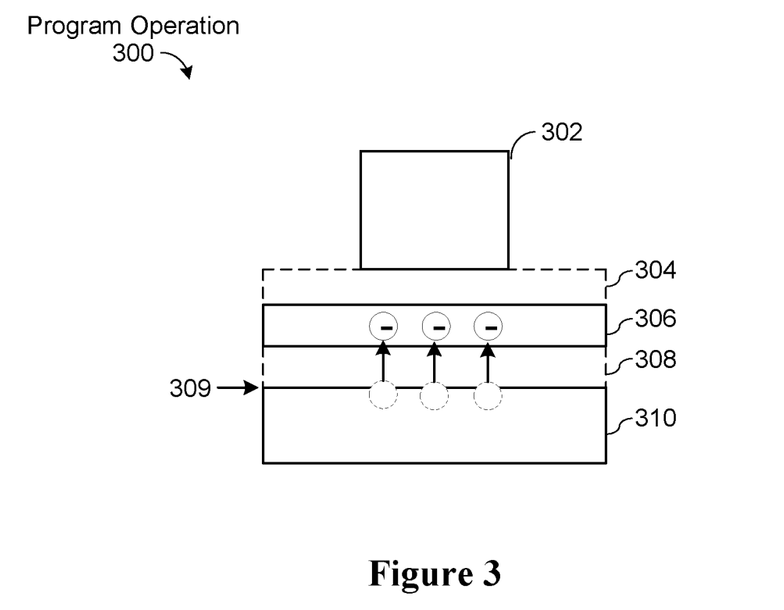
FIG. 3 is a diagram of a memory cell in accordance with some embodiments.

FIG. 3 illustrates a programmed state of a memory cell (e.g., cell 208 in FIG. 2) in accordance with some embodiments. The memory cell includes a control gate 302, a floating gate 306, and a conducting channel 310. In some implementations (e.g., 3D NAND), the floating gate 306 is referred to as a charge trap layer, and the conducting channel is referred to as a memory hole. The memory cell also includes a tunnel oxide layer 308 disposed between the floating gate 306 and conducting channel 310, and a gate oxide layer 304 disposed between the control gate 302 and floating gate 306.

During a read operation, a read voltage is applied to the control gate 302. If the floating gate 306 is programmed (i.e., electrons are present in the floating gate), a current will not flow in the conducting channel 310, which is interpreted as logic 0. If the floating gate 306 is erased (i.e., electrons are mostly not present in the floating gate), a current will flow in the conducting channel 306, which is interpreted as logic 1. For MLC, TLC, and QLC memory, an amount of current is measured for successively applied read voltages to determine which logic is represented (e.g., 11, 10, 01, 00 for MLC).

During a write operation, a high voltage (e.g., 12V) is applied to the control gate 302, which pulls electrons from the conducting channel 310 into the floating gate 306. The electrons enter the floating gate 306 by escaping the conducting channel 310 and tunneling through the oxide 308. For MLC, TLC, and QLC memory, a plurality of voltages are required to pull different quantities of electrons into the floating gate. For example, in TLC memory cells (FIG. 4C), each state A-G is associated with a different amount of charge on the floating gate, the quantities of which affect how much read current can pass through the conducting channel. In some implementations, the program operation comprises one or more program pulses, during which successively increasing voltages are applied to the control gate in order to pull successively increasing quantities of electrons onto the floating gate.

FIGS. 4A-4C illustrate cell voltage thresholds and corresponding read voltage levels (also sometimes referred to as reference voltage levels) for read operations.

For instance, in an SLC memory cell (FIG. 4A), there are two threshold voltages: E (for the erase state: 1) and A (for the programmed state: 0). When applying a read voltage signal 402, if current flows through the memory cell, the cell is erased (e.g., logic 1). If current does not flow through the memory cell, the cell is programmed (e.g., logic 0).

In a two-bit MLC memory cell (FIG. 4B), there are four threshold voltages: E (for the erase state: 1), and A-C (for three programmed states: 01, 00, 10). When applying a read voltage signal 412, if current flows through the memory cell above a first threshold, the cell is erased (e.g., logic 11). When applying a voltage 414, if current flows below the first threshold but above a second threshold, the cell is in a first programmed state (e.g., logic 01). When applying a voltage 416, if current flows below the second threshold but above a third threshold, the cell is in a second programmed state (e.g., logic 00), and if current flows below the third threshold, the cell is in a third programmed state (e.g., logic 10).

In a three-bit TLC memory cell (FIG. 4C), there are eight threshold voltages: E (for the erase state: 1), and A-G (for seven programmed states: 011, 001, 000, 010, 110, 100, 101). When applying a read voltage 418, if current flows through the memory cell above a first threshold, the cell is erased (e.g., logic 111). The rest of the read voltages are selected such that they are between the voltage thresholds of the remaining programmed states, as described above with regard to FIG. 4B.

Implementations Requiring High Endurance

In some applications of the data storage system 100 described above, read and write performance requirements are relatively low, and endurance requirements are relatively high. For example, in some implementations, host 110 is a processing system on a vehicle, sometimes referred to as an engine control unit (ECU). In some implementations, the ECU includes one or more controllers and memory operatively coupled with one or more sensors embedded in the vehicle, and the data transmitted by the ECU for storage in storage device 120 includes sensor data from one or more of the sensors. In these applications, the storage device 120 is implemented as a black-box event data recorder (EDR).

In some EDR implementations, the sensor data (data provided by host 110 through data connection 101) describes successive states of the vehicle, driver of the vehicle, and/or environment in proximity to the vehicle. Example sensor data may include driver operation data describing a driver's interaction with the various control systems of the vehicle, such as accelerator pedal operation data, brake pedal operation data, and/or steering wheel operation data. Example sensor data may include environmental data describing successive states of the environment surrounding the vehicle, such as distance between the vehicle and other vehicles or objects in the vicinity of the vehicle, characterization of other vehicles or objects in the vicinity of the vehicle, road condition data, speed limit or traffic signal data, road markings, and so forth. Example sensor data may include driver awareness data (e.g., whether the driver's hands are on the steering wheel, whether the driver's eyes are facing forward, whether a phone call or other communication is being conducted), an event log (e.g., including warnings for the driver to control the vehicle), vehicle health data (e.g., fuel level, error codes, and so forth) and/or any other sensor data which indicates the state of the driver, vehicle, and/or environment at any given moment.

Regarding read performance in the EDR implementations described herein, reading is very rare. A different host 110 reads from the storage device 120 (versus the host that writes to the storage device 120). For example, while the ECU in the vehicle writes the sensor data and other vehicle-related data as described above to the storage device 120, in the event of a crash, the storage device 120 would be removed from the vehicle and read in another setting, such as a lab, by a computer system optimized for reading data from EDR storage devices recovered from accidents (also referred to as being read "offline"). Since the storage device 120 is read from only if and when an accident occurs, such a storage device may be configured as a repetitive "write only" device where the read performance requirements are relatively low. As such, read performance, which is typically a storage bottleneck, may be significantly compromised for EDR storage devices.

Regarding write performance in the EDR implementations described herein, the write rate is relatively moderate. In some implementations, the rate at which the storage device 120 is programmed is 60 MB per second. Depending on EDR and vehicle-specific specifications, however, this rate may be higher or lower. While it may be possible to write at a higher rate, many vehicle sensors do not transmit data as fast as the program capacity of the storage device 120. As such, write performance may be compromised for EDR storage devices.

Regarding endurance in the EDR implementations described herein, some jurisdictions require black box EDR storage devices to reliably store sensor data and other information over a lifetime equivalent to 8 hours of driving per day over the course of 15 years. This roughly translates to a requirement for the total EDR endurance capacity to be 1,400 Terabytes Written (TBW). On the other hand, not all of this data needs to be permanently stored. For example, one requirement may be to have data from 30 seconds before an accident occurred and 30 seconds after the accident occurred. The data collected during these time windows is sometimes referred to herein as "user data." The user data may only be 4 GB of data. Depending on vehicle specifications, EDR specifications, and timing window requirements, however, the amount of user data may be higher or lower. While this disclosure refers to the example requirements of 1,400 TBW and 4 GB of user data, it should be understood that these numbers are only examples and not meant to be limiting to the concepts described herein.

Conventional storage devices optimized for cost may include only enough memory to capture the required user data, but such devices do not meet the endurance requirements. On the other hand, conventional storage devices may be designed to meet the endurance requirements, but such devices would include much more memory than required to capture the user data, and would therefore be more expensive. Accordingly, there is a need for storage devices which may be optimized for cost (i.e., relatively low memory footprint) but can also meet the endurance requirements of a black box EDR.

Endurance Improvements

The implementations described herein increase endurance of storage devices without adding additional cost in the form of increased memory. For example, while a conventional SLC storage device may perform 100K program/erase cycles (PEC) in its lifetime, the implementations described herein allow storage devices to perform between 500K and 1M PEC cycles. These numbers are high enough to meet an endurance requirement of 1,400 TBW.

Referring back to FIGS. 4A-4C, the more bits that can be stored in a memory cell, the slower the performance will be, but the cheaper the cost as well (due to the lower memory footprint). Therefore, a multi-level cell architecture would be useful in a black box EDR optimized for cost. Therefore, the TLC implementation shown in FIG. 4C will be cheaper than the SLC implementation shown in FIG. 4A.

As another consideration, the higher the programming voltage, the lower the endurance (the amount of times the cell can be programmed while data can reliably be stored and read from the cell). Regardless of the type of program operation or the type of memory cell, the memory cell's endurance is inversely proportional to the quantity of electrons passing through the tunneling oxide (308, FIG. 3) over the cell's lifetime. Stated another way, the more electrons tunnel through the oxide 308, the greater the negative effect on the memory cell's endurance. This is due in part to the oxide 308 becoming less of a barrier to tunneling electrons with successive program operations, which causes a particular control gate voltage to cause the floating gate to acquire increasingly more charge, which in turn affects the read distributions for each state. Stated another way, as the oxide 308 becomes less resistant to tunneling electrons, program voltages applied to the control gate 302 will cause the state distributions shown in FIGS. 4A-4C to widen and eventually overlap, leading to increased read errors.

Therefore, choosing a multi-level scheme but limiting the program states to those on the lower end of the voltage spectrum (to the left of the Vth axis in FIGS. 4A-4C) will optimize the memory cell for (i) cost, due to the smaller memory footprint made possible by the use of multi-level cells, and (ii) endurance, due to the lower voltages required to program the cells.

A two-level pseudo-TLC programming scheme using, for example, states A and C (and gradually other states) may be based on a TLC programming scheme with lower, middle, and upper pages, with an appropriate finer programming trim and rate. However, for this pseudo-TLC scheme, all of the data is programmed only to two states (A and C or other TLC levels as discussed below). Since the write time is not a limitation, MLC, QLC, and any other programming scheme involving more than two states (not just TLC) can be used and may even be relaxed using finer programming step size in order to improve endurance. The separation distance requirement between the two states may also be more relaxed since more protection bits may be used in a decoder that is less limited by read latency.

Figure 5A:
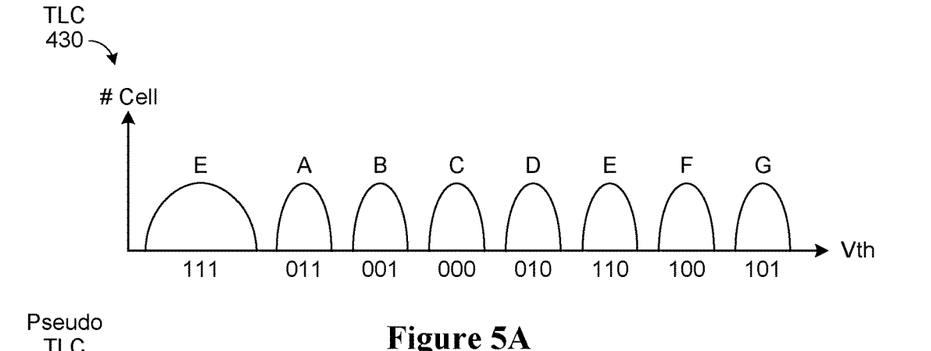
FIGS. 5A-5D are graphs showing threshold voltage distributions of example memory cells, in accordance with some embodiments.

FIGS. 5A-5D illustrate a pseudo-TLC scheme for encoding memory cells using a subset, less than all, of the available program states. While TLC is used in this example, the underlying concepts also apply to MLC, QLC, and any other programming scheme involving more than two states. FIG. 5A illustrates the available program states A-G for a TLC memory cell, as well as the erase state E. In the pseudo-TLC programming scheme, a TLC memory cell may be programmed to only represent two states, similar to an SLC programming scheme. However, in the pseudo-TLC scheme, the two states are represented by two of the TLC states (e.g., states A and B in FIG. 5B) instead of the two SLC states (E and A in FIG. 4A). The voltages required to program states A and B in pseudo-TLC scheme 510-1 (FIG. 5B), for instance, are lower than the voltage required to program state A in SLC scheme 410 (FIG. 4A), and therefore, endurance is increased.

Memory cells programmed using the pseudo-TLC scheme will eventually cause read errors due to the proximity of the programming states (e.g., states A and B in scheme 500-1). This is known as device wear, and is caused by the oxide layer between the floating gate and the control gate becoming less resistant to tunneling electrons as discussed above. Accordingly, rather than label the cell as unusable, the storage controller 124 may shift the states so they are farther from each other, while still keeping the states on the lower end of the voltage spectrum (closer to the left of the Vth axis in FIGS. 5A-5D). For example, when the storage controller determines that a wear level of a particular cell or plurality of cells is above a threshold, the storage controller may shift the second program state form B to C, as shown in pseudo-TLC scheme 500-2 in FIG. 5C. Since there is more space between states A and C, the voltage distributions may widen without causing a prohibitive amount of errors (a number of errors that is too high for the error control module 125 to correct using various ECC processes). Eventually, however, the distributions for states A and C may cause a prohibitive amount of errors, and the storage controller may shift the states again as a result, as shown in pseudo-TLC scheme 500-3 in FIG. 5D.

Figure 5B:
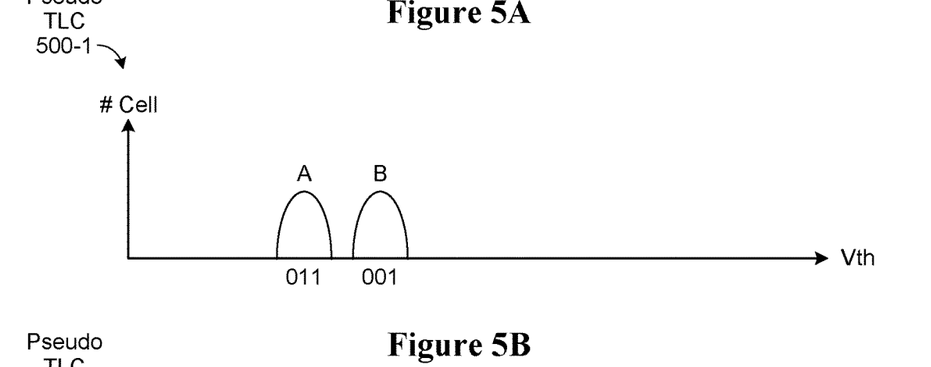
Figure 5C:
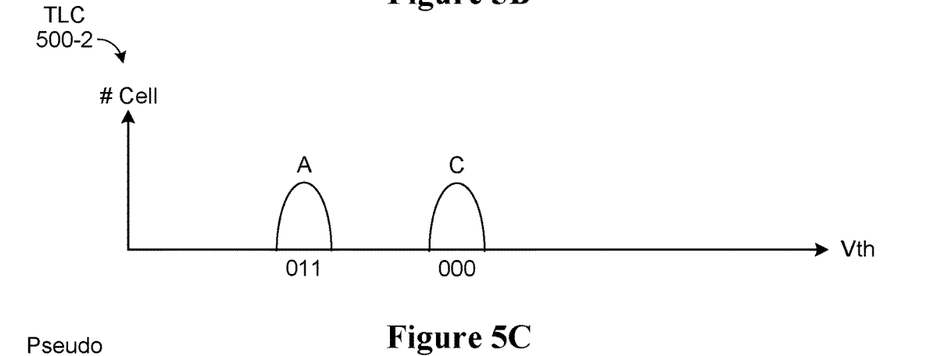
Figure 5D:
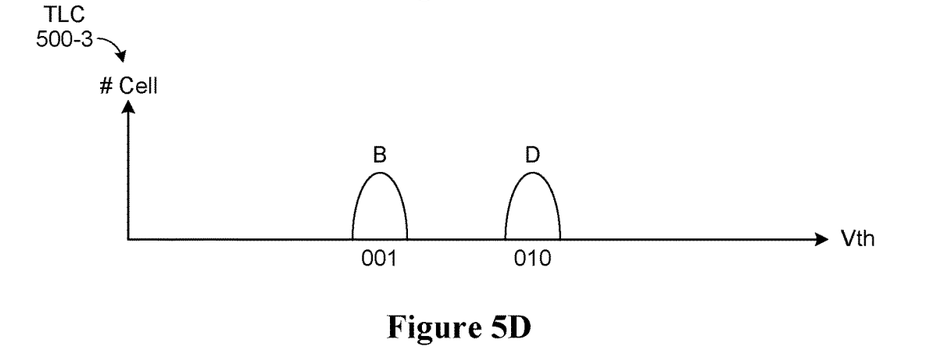

In some implementations, the program state shifts described with reference to FIGS. 5B-5D may be triggered based on an amount of wear. A wear detection module of the storage controller may detect or estimate wear on a memory cell or a plurality of memory cells by keeping track of the number of program-erase cycles (PEC) of each cell. After various PEC thresholds, the program states may be shifted in order to prevent a prohibitive amount of wear-related errors. Additionally or alternatively, the wear detection module may detect or estimate wear by keeping track of the life of the device. After various time or use thresholds (e.g., after 1 year of use, 2 years of use, and so forth), the program states may be shifted in order to prevent a prohibitive amount of wear-related errors. Additionally or alternatively, the wear detection module may cause a diagnostic read to be performed on one or more memory cells for the purpose of determining a quantity of errors or width and/or location of the various state distributions. Based on the number of detected errors, distribution width, and/or distribution locations, the program states may be shifted in order to prevent a prohibitive amount of wear-related errors.

In some implementations, the program state distributions (also referred to as windows) may be configured to be relatively narrow. The voltage distributions for each program state may be made narrower by using smaller step sizes between successive program pulses. The smaller the step size, the longer it takes to program. However, for EDR implementations, program performance may be compromised as long as minimal throughput requirements are met in order to capture the sensor data and other vehicle data being provided by the ECU 110 for storage, as discussed above. In addition or as an alternative to program state modifications, the storage controller may also adjust one or more programming trim parameters in order to optimize endurance. Programming trim parameters include window size, starting voltage, step size, verify level, read level on word lines, and so forth.

Figure 6A:
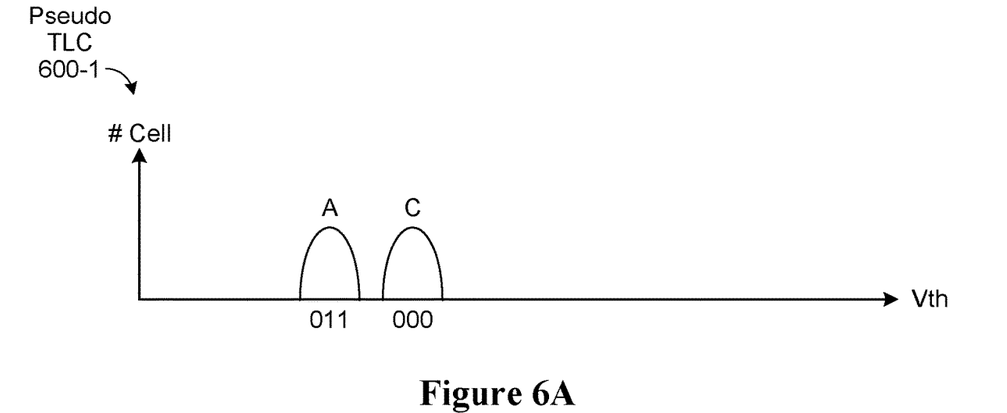
FIGS. 6A-6B are graphs showing threshold voltage distributions of example memory cells, in accordance with some embodiments.
Figure 6B:
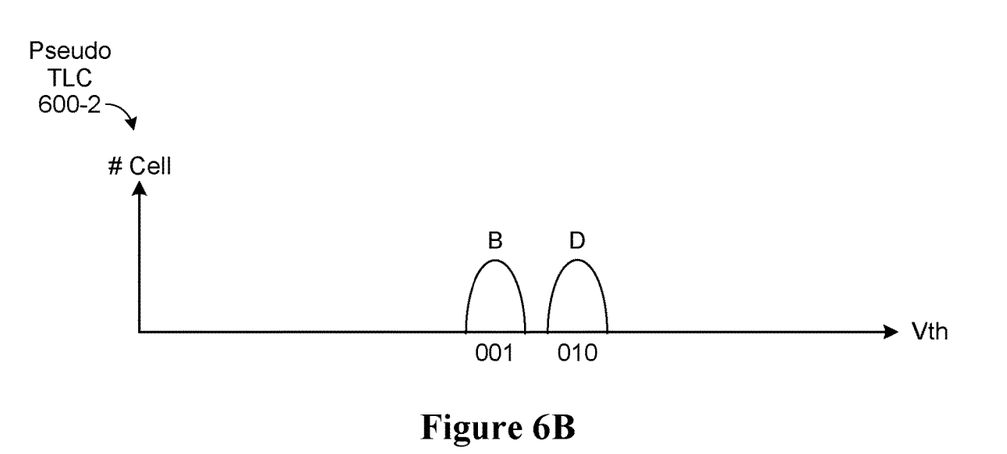

In some implementations, the distance between the program states may be decreased compared to conventional TLC schemes. For example, the distance between program states may be decreased from 800 mV to 400 mV, or less than 400 mV. FIGS. 6A and 6B illustrate a pseudo-TLC scheme 600 for encoding memory cells using only a subset of the available program states, where the distance between the program states is decreased. For example, in pseudo-TLC scheme 600-1 (FIG. 6A), states A and C are closer together than corresponding states in scheme 500-2 (FIG. 5C). Likewise, in pseudo-TLC scheme 600-2 (FIG. 6B), states B and D are closer together than corresponding states in scheme 500-3 (FIG. 5D).

Figure 7A:
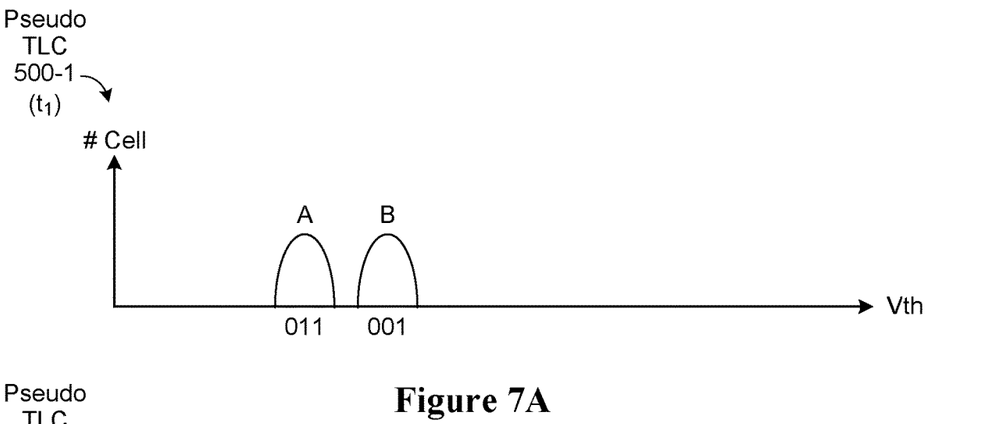
FIGS. 7A-7C are graphs showing threshold voltage distributions of example memory cells, in accordance with some embodiments.
Figure 7B:
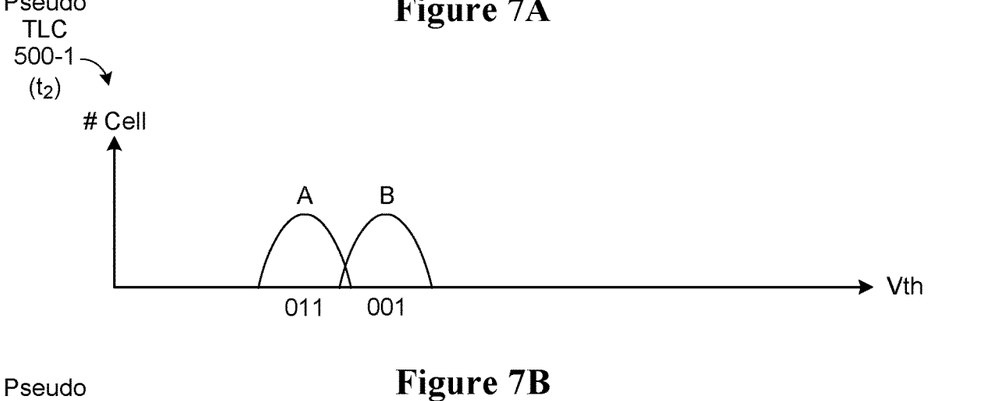
Figure 7C:
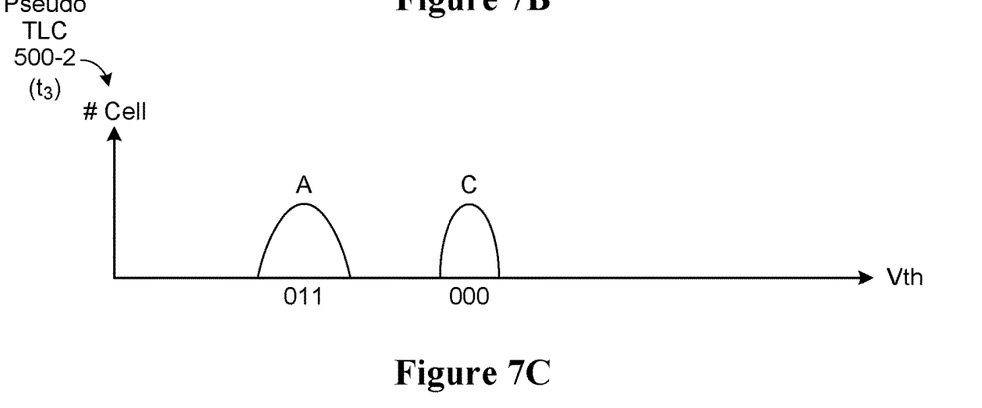

FIGS. 7A-7C illustrate shifting program states due to widening voltage threshold distributions corresponding to the program states. At a first time ($t_1$), using pseudo-TLC scheme 500-1 as illustrated in FIG. 7A, the program states are A (011) and B (001) as described above with reference to FIG. 5B. After a certain number of program operations have occurred, the voltage distributions have widened at a subsequent time ($t_2$), as shown in FIG. 7B. The voltage distributions have widened due to wear, and the overlap between the distributions may increasingly cause errors as it grows. When the overlap reaches a threshold associated with a prohibitive number of errors, the storage controller shifts the second program state (B) to the right, as shown in the pseudo-TLC scheme 500-2 illustrated in FIG. 7C (corresponding to FIG. 5C). The shifted second program state (now C) no longer overlaps with program state A, minimizing wear-related errors. Even though program state C requires more voltage for the floating gate to be programmed, the voltage may still be less than the distribution A in the SLC scheme 410 shown in FIG. 4A, thereby increasing endurance by allowing for lower program voltages.

The pseudo-TLC schemes described above implement an SLC scheme (employing only two states per cell) using TLC program distributions (seven possible program states). Therefore, when writing data X to a particular cell using states A (011) and C (000), the storage controller would cause the following to be programmed to the lower, middle, and upper pages of the cell, respectively: 0 X X. This corresponds with the 011 and 000 values of states A and C (with the data to be written, 1 or 0, standing in for X).

In addition or as an alternative to the pseudo MLC/TLC/QLC two-level programming features described above, memory cell endurance may be increased by increasing the number of parity bits used with codewords in programming operations. Increased parity means more errors may be absorbed, due to the error control module 125 being able to make more effective use of ECC processes to recover errors. In some embodiments, the number of parity bits is increased such that the code rate (the number of bits in a codeword which represent the data versus the total number of bits in the codeword including ECC parity bits) is 0.6 or less. Additional parity bits result in slower program speeds, but in EDR applications, program performance may be compromised for the reasons discussed above in order to optimize endurance. With the increased error resiliency caused by the addition of parity bits, separation distance between states (e.g., states A and C in FIGS. 5C and 6A) can be more relaxed, since a higher area of overlap between the two states may be allowed. The amount of time between state shifts may be increased for the same reason (increased resiliency allows for more overlap between states). By allowing for less distance between program states and more time between shifts, program operations may use lower voltages for longer amounts of time, thereby further increasing endurance.

Additional parity bits may also be implemented by increasing the memory footprint. The size of the memory may be increased by increasing the ratio of the physical capacity (e.g., all memory cells that are physical present) to the export capacity (e.g., only the addressable memory cells). The memory cells which are physically present but not addressable may be used for error correction operations (e.g., parity bits). By increasing the physical capacity to export capacity ratio to 50:1 (0.02 export to physical capacity ratio), the amount of physical memory cells available for error correction operations increases, enabling increased error resiliency as described above. For example, rather than choosing between a 512 GB storage device (optimizing endurance at the expense of cost) and a 16 GB storage device (optimizing cost at the expense of endurance), a 32 GB or a 64 GB storage device may be chosen, thereby maintaining a relatively low memory footprint compared to the 512 GB storage device (and thus, low cost), but at the same time, doubling or quadrupling the amount of storage available over the amount required to store the 4 GB of user data (referred to as "overprovisioning"). The greater the overprovisioning, the more storage space is available for parity bits. In some embodiments, the physical capacity to export capacity ratio may be as low as 2:1 (0.50 export to physical capacity ratio).

In addition or as an alternative to the pseudo MLC/TLC/QLC two-level programming features described above, increasing the length of codewords (e.g., convolutional low-density parity-check (CLDPC) codewords) also increases endurance. Long codewords may be implemented with different code rates. For example, for a codeword length of 4.5 KB, the code length can be set to 4 KB with 512 bytes of parity, resulting in a code rate of 0.9. Alternatively, the code length can be set to 2.25 KB with 2.25 KB of parity, resulting in a code rate of 0.5. Increasing the length of codewords means read time is increased since an entire codeword needs to be decoded in order to read the data within that codeword. However, since read performance in EDR implementations may be sacrificed for the reasons described above, the better correction capability associated with longer codewords (and thus, the higher endurance) may outweigh the decreased read performance. For example, after an accident, data may be read from a black box EDR in a lab at a reduced speed. The additional time it may take to read the data (hours instead of minutes) may not be a major factor in the design of the EDR since the data only needs to be read once, and the data set is limited (e.g., 30 seconds before and after the accident). The use of CLDPC is described in U.S. patent application Ser. No. 15/817,442, which is hereby incorporated by reference in its entirety.

By implementing the features above with respect to increased physical to export capacity ratios, additional parity bits, and/or increased codeword lengths, the amount of grown physical bad blocks may be tolerated up to and past 5% of all physical blocks (or of all addressable blocks), and up to 95% of all physical blocks (or of all addressable blocks).

In addition or as an alternative to the pseudo MLC/TLC/QLC two-level programming features described above, other endurance boosting techniques may be used to increase endurance.

For example, the storage controller may use tunable ECC (TECC) techniques to boost endurance. Since not all blocks of data have the same error rates, the storage controller may use more parity to program cells with higher errors and less parity to program cells with lower errors, which saves storage capacity. The additional storage capacity available for programming increases endurance, since the programming operations may be spread over the available memory ells. For example, instead of using 50% parity bits for every memory cell, the storage controller may use 50% parity for only 1% of the cells, 40% for 20% of the cells, and so forth.

As another example, the storage controller may use endurance coding and/or shaping, which adds more parity bits in order to reduce the number of cells which are programmed, which reduces wearing, and thereby increases endurance.

As another example, the storage controller (e.g., encoder 126) may compress the data to be programmed using one or more compression processes. This results in less data to write, which increases endurance.

As another example, the storage controller may use partial good block (PGB) techniques to increase endurance. For example, if a block is not completely unusable (e.g., a subset of the word lines are causing errors), rather than cease using the entire block, the storage controller may continue using the parts of the block which are still usable (e.g., the word lines which do not cause errors). This results in the retiring of fewer blocks, which increases endurance.

As another example, the storage controller may use extended read times and/or multiple read operations to reduce noise. The storage controller can read with soft information, which gives ECC processes the ability to correct more errors, which increases endurance.

As another example, the storage controller may use direct look ahead (DLA) techniques, which involve using the next word line to reduce cross coupling. This extends read times, but the increased endurance outweighs the decreased read performance for the reasons discussed above.

As another example, the storage controller may use joint ECC and RAID (JLR) techniques, which improve large tail high ECC events. Assuming no critical failures, but highs number of errors, JLR may improve ECC techniques by using the extra parity which is meant for critical failures. Since the storage controller can use the parity in the RAID for making the states closer, this reduces wear and thereby increases endurance.

Figure 8:
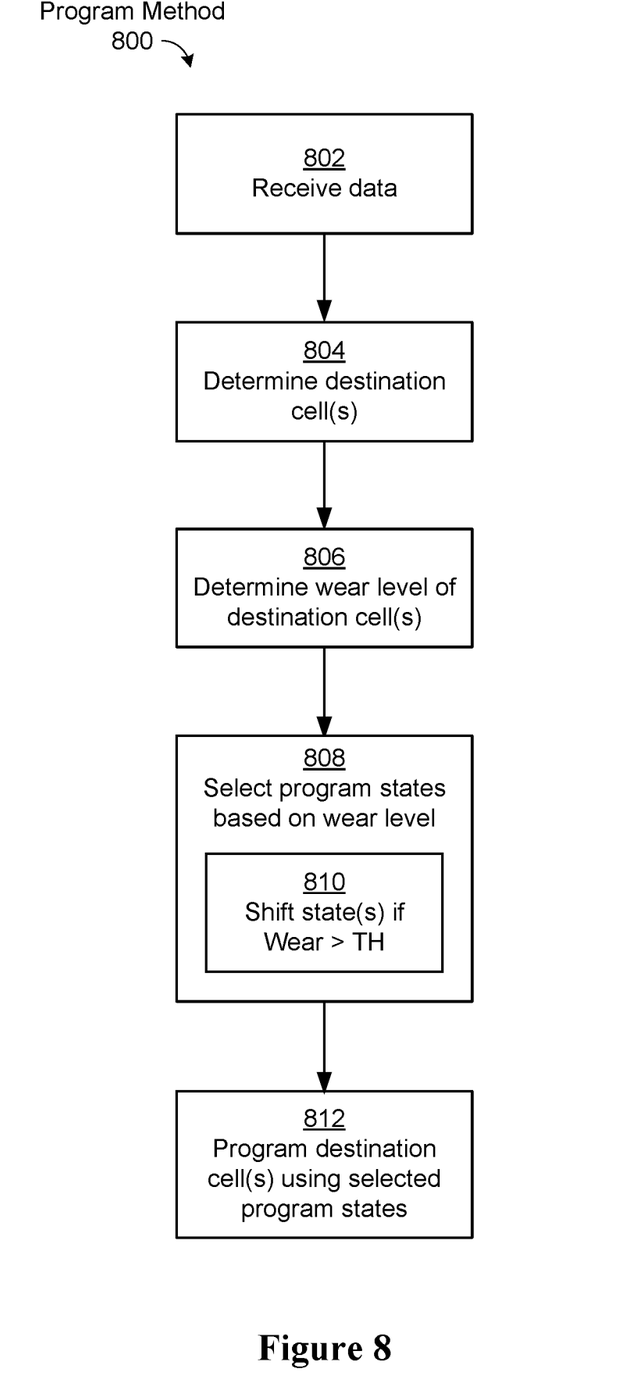
FIG. 8 is a flow chart showing a method for programming a memory cell, in accordance with some embodiments.

FIG. 8 depicts a flowchart of a method 800 of programming a memory cell using a pseudo MLC/TLC/QLC two-level programming scheme. Method 800 is typically performed by the storage controller 124 or management module 121 of a storage device 120 or storage system, but alternatively may be performed by a computer system (e.g., host 110) in which a storage device is embedded. In some implementations, various operations in the method 800 may be reordered or omitted.

The storage controller receives (802) data to be written (e.g., vehicle sensor data as described above), and determines (804) one or more memory cells of the plurality of memory cells as a destination for the data to be written, wherein the one or more memory cells are configured to be programmed using at least three program states (e.g., MLC, TLC, or QLC program states as described above). The storage controller determines (806) a wear level of the one or more memory cells (e.g., using any of the wear level detection or estimation techniques described above). The storage controller selects (808) a first program state and a second program state (e.g., TLC states A and B, FIG. 7A) of the at least three program states for each of the one or more memory cells based on the wear level of the one or more memory cells. In some implementations, the storage controller shifts (810) a previously selected program state program (e.g., from state B to state C, FIG. 7C) based on the determined wear level (and/or other error metrics) associated with the memory cell and/or the particular program state. Upon selecting program states, the storage controller programs (812) the destination cells using the selected program states.

Implementations of the pseudo-MLC/TLC/QLC two level programming scheme described above combined with low coding rate (e.g., 50%) due to a higher number of parity bits provide high endurance of the order of 500,000 cycles and more for a 32 GB or 64 GB NAND storage device. These concepts may be used in any application with similar requirements of low read/write rates and high endurance, such as IOT devices.

Additionally, it should be noted that the implementations described above do not require conventional wear leveling protection since writing is always on, continuously covering the memory address space of the storage device; therefore, the flash management firmware may be much simpler. As such, write amplification may be significantly reduced (e.g., since no compaction for data lifetime management operations such as garbage collection is needed). It should also be noted that using different MLC/TLC/QLC states instead of the Erase (E) state is beneficial also in terms of not over erasing cells. Over-erased cells become outliers that may cause a complete device failure; using higher programmed states as proposed herein prevents this over-erase failure.

It will be understood that, although the terms "first," "second," etc. may be used herein to describe various elements, these elements should not be limited by these terms. With the exception of the phrases "first read condition" and "second read condition," the terms "first," "second," etc. are only used to distinguish one element from another. For example, a first contact could be termed a second contact, and, similarly, a second contact could be termed a first contact, without changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A data storage system, comprising:
 a non-volatile memory (NVM) including a plurality of memory cells, wherein the NVM has a ratio of defined export capacity to physical capacity that is greater than 0.02 and less than 0.50; and
 a controller coupled with the NVM, wherein the controller receives data from a host and writes the data in the NVM, wherein the controller is configured to:
  calculate an error correcting code (ECC) for the received data and save the ECC with the received data, wherein an ECC code rate is less than 0.60;
  determine a first memory cell of the plurality of memory cells as a destination for the data to be written, wherein the first memory cell is configured to be programmed using at least three program states;
  determine a wear level of the first memory cell;
  select a subset of the at least three program states, including a first program state and a second program state, for the first memory cell based on the wear level of the first memory cell to render at least one program state not included in the subset as unavailable for programming; and
  program the memory cell using one of the first and second program states.

2. The data storage system of claim 1, wherein the NVM comprises a plurality of blocks and an allowed number of grown physical bad blocks is greater than 5% and less than 95% of the plurality of blocks.

3. The data storage system of claim 1, wherein the system is a black box recording device in a vehicle and the data from the host comprises event data generated by a plurality of vehicle sensors.

4. The data storage system of claim 1, wherein selecting the first program state and the second program state comprises:
 determining which of the at least three program states are available for programming; and
 selecting, as the first program state and the second program state, two available states associated with the lowest program voltage.

5. The data storage system of claim 4, wherein determining which of the at least three program states are available for programming comprises:
 determining a distribution width or an error rate of the at least three program states; and
 classifying a particular program state of the at least three program states as available for programming based on the distribution width or the error rate of the particular program state.

6. The data storage system of claim 1, wherein selecting the first program state and the second program state comprises:
 determining the wear level of the first memory cell with respect to one or more program states based on program state distribution width of the one or more program states;
 shifting one of a previously selected first program state or a previously selected second program state to a new program state based on the determined wear level of the first memory cell with respect to the one or more program states.

7. The data storage system of claim 6, wherein shifting one of the previously selected first program state or the previously selected second program state to the new program state comprises selecting, as the new program state, a program state corresponding to a higher program voltage than a program voltage of the one of the previously selected first or second program state.

8. The data storage system of claim 1, wherein determining a wear level of the first memory cell comprises:
 counting program-erase cycles (PEC) of the first memory cell; and
 determining the wear level based on whether a number of PEC of the first memory cell is above a threshold.

9. The data storage system of claim 1, wherein determining a wear level of the first memory cell comprises:
 performing a diagnostic read operation on the first memory cell; and
 determining a quantity of errors or a program state distribution width based on the diagnostic read operation; and determining the wear level based on the whether the quantity of errors or the program state distribution width is above a respective threshold.

10. A method of storing data in a black box recorder system for a vehicle, the block box recorder system comprising the data storage system of claim 1 comprising a memory including a plurality of memory cells, and a controller in communication with the memory, the method comprising:
 determining a first memory cell of the plurality of memory cells as a destination for the data to be written, wherein the first memory cell is configured to be programmed using at least three program states;
 determining a wear level of the first memory cell;
 selecting a subset of the at least three program states, including a first program state and a second program state, for first memory cell based on the wear level of the first memory cell to render at least one program state not included in the subset as unavailable for programming; and
 programming the first memory cell using one of the first and second program states.

11. The method of claim 10, wherein selecting the first program state and the second program state comprises:
 determining which of the at least three program states are available for programming; and
 selecting, as the first program state and the second program state, two available states associated with the lowest program voltage.

12. The method of claim 11, wherein determining which of the at least three program states are available for programming comprises:
 determining a distribution width or an error rate of the at least three program states; and
 classifying a particular program state of the at least three program states as available for programming based on the distribution width or the error rate of the particular program state.

13. The method of claim 10, wherein selecting the first program state and the second program state comprises:
 determining the wear level of the first memory cell with respect to one or more program states based on program state distribution width of the one or more program states;
 shifting one of a previously selected first program state or a previously selected second program state to a new program state based on the determined wear level of the first memory cell with respect to the one or more program states.

14. A data storage system, comprising a memory comprising a plurality of memory cells; and a controller in communication with the memory, the controller configured to:
 receive data to be written;
 determine a first memory cell of the plurality of memory cells as a destination for the data to be written, wherein the first memory cell is configured to be programmed using at least three program states;
 determine a wear level of the first memory cell;
 select a subset of the at least three program states, including a first program state and a second program state, for the first memory cell based on the wear level of the first memory cell to render at least one program state not included in the subset as unavailable for programming; and
 program the first memory cell using one of the first and second program states.

15. The data storage system of claim 14, wherein selecting the first program state and the second program state comprises:
 determining which of the at least three program states are available for programming; and
 selecting, as the first program state and the second program state, two available states associated with the lowest program voltage.

16. The data storage system of claim 15, wherein determining which of the at least three program states are available for programming comprises:
 determining a distribution width or an error rate of the at least three program states; and
 classifying a particular program state of the at least three program states as available for programming based on the distribution width or the error rate of the particular program state.

17. The data storage system of claim 14, wherein selecting the first program state and the second program state comprises:
 determining the wear level of the first memory cell with respect to one or more program states based on program state distribution width of the one or more program states;
 shifting one of a previously selected first program state or a previously selected second program state to a new program state based on the determined wear level of the first memory cell with respect to the one or more program states.

18. The data storage system of claim 17, wherein shifting one of the previously selected first program state or the previously selected second program state to the new program state comprises selecting, as the new program state, a program state corresponding to a higher program voltage than a program voltage of the one of the previously selected first or second program state.

19. A black box recorder system for a vehicle, the black box recorder system comprising:
 a data storage system comprising a plurality of memory cells; and
 a controller in communication with the plurality of memory cells, the controller comprising:
  means for determining a first memory cell of the plurality of memory cells as a destination for the data to be written, wherein the first memory cell is configured to be programmed using at least three program states;
  means for determining a wear level of the first memory cell;
  means for selecting a subset of the at least three program states, including a first program state and a second program state, for the first memory cell based on the wear level of the first memory cell to render at least one program state not included in the subset as unavailable for programming; and
  means for programming the first memory cell using one of the first and second program states.

* * * * *